(12) United States Patent
Tsang

(10) Patent No.: US 6,870,759 B2
(45) Date of Patent: Mar. 22, 2005

(54) MRAM ARRAY WITH SEGMENTED MAGNETIC WRITE LINES

(75) Inventor: David Tsang, Cupertino, CA (US)

(73) Assignee: Applied Spintronics Technology, Inc., Milpitas, CA (US)

( * ) Notice: Subject to any disclaimer, the term of this patent is extended or adjusted under 35 U.S.C. 154(b) by 0 days.

(21) Appl. No.: 10/646,455

(22) Filed: Aug. 21, 2003

(65) Prior Publication Data

US 2004/0264239 A1 Dec. 30, 2004

Related U.S. Application Data

(60) Provisional application No. 60/431,742, filed on Dec. 9, 2002.

(51) Int. Cl.[7] .............................................. G11C 11/02
(52) U.S. Cl. ......................................... 365/158; 365/63
(58) Field of Search ................................ 365/158, 157, 365/63, 230.03

(56) References Cited

U.S. PATENT DOCUMENTS

| | | | |
|---|---|---|---|
| 5,659,499 A | 8/1997 | Chen et al. ................. 365/158 |
| 5,940,319 A | 8/1999 | Durlam et al. .............. 365/171 |
| 6,153,443 A | 11/2000 | Durlam et al. ................. 438/3 |
| 6,211,090 B1 | 4/2001 | Durlam et al. .............. 438/692 |
| 6,335,890 B1 | 1/2002 | Reohr et al. ............. 365/225.5 |
| 6,532,163 B2 * | 3/2003 | Okazawa ...................... 365/97 |
| 2002/0034117 A1 | 3/2002 | Okazawa ............... 365/230.03 |
| 2002/0080643 A1 | 6/2002 | Ito ............................. 365/158 |
| 2002/0127743 A1 | 9/2002 | Nickel et al. ................... 438/3 |
| 2002/0176272 A1 | 11/2002 | DeBrosse et al. ............. 365/97 |

* cited by examiner

*Primary Examiner*—Tan T. Nguyen
(74) *Attorney, Agent, or Firm*—Sawyer Law Group LLP

(57) ABSTRACT

A magnetic random access memory (MRAM) array and method for making the MRAM array are disclosed. The MRAM array includes magnetic storage cells, global word lines, magnetic word lines, read bit lines, selection devices, and write bit lines. Each magnetic word line has segments. Each segment is coupled with the global word line(s) such that each segment is separately selectable. Each segment is also coupled to a portion of the magnetic storage cells. The read bit lines are oriented at an angle with respect to the magnetic word lines. The read bit lines are coupled with the magnetic cells through the selection devices. The write bit lines are substantially parallel to the read bit lines. Preferably, the magnetic word lines include soft magnetic materials and are coupled to each magnetic storage cell through a thin, nonmagnetic layer. To reduce interference from currents in global word lines, the global word lines are also substantially parallel to the magnetic word lines.

17 Claims, 4 Drawing Sheets

MRAM ARRAY WITH SEGMENTED MAGNETIC WRITE LINES

CROSS-REFERENCE TO RELATED APPLICATIONS

The present application is related to co-pending U.S. patent application Ser. No. 60/431,742 entitled "MRAM CELLS WITH MAGNETIC WRITE LINES", filed on Dec. 9, 2002, and assigned to the assignee of the present application.

FIELD OF THE INVENTION

The present invention pertains to magnetic memories, and more particularly to a method and system for providing a magnetic random access memory (MRAM) that is preferably high density, nonvolatile and that has an architecture incorporating magnetic write lines.

BACKGROUND OF THE INVENTION

Recently, a renewed interest in thin-film magnetic random access memories (MRAM) has been sparked by the potential application of MRAM to both nonvolatile and volatile memories. FIG. 1 depicts a portion of a conventional MRAM 1. The conventional MRAM includes conventional orthogonal conductor lines 10 and 12, conventional magnetic storage cell 11 and conventional transistor 13. The conventional MRAM 1 utilizes a conventional magnetic tunneling junction (MTJ) stack 11 as a memory cell. Use of a conventional MTJ stack 11 makes it possible to design an MRAM cell with high integration density, high speed, low read power, and soft error rate (SER) immunity. The conductive lines 10 and 12 are used for writing data into the magnetic storage device 11. The MTJ stack 11 is located on the intersection of and between 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 11 stack primarily includes the free layer 1104 with the changeable magnetic vector (not explicitly shown), the pinned layer 1102 with the fixed magnetic vector (not explicitly shown), and the insulator 1103 in between the two magnetic layers 1104 and 1102. The insulator 1103 typically has a thickness that is low enough to allow tunneling of charge carriers between the magnetic layers 1102 and 1104. Layer 1101 is usually a composite of seed layers and an anti-ferromagnetic layer that is strongly coupled to the pinned magnetic layer.

Data is stored in the conventional MTJ stack 11 by applying a magnetic field to the conventional MTJ stack 11. The applied magnetic field has a direction chosen to move the changeable magnetic vector of the free layer 1104 to a selected orientation. During writing, the electrical current $I_1$ flowing in the conventional bit line 12 and $I_2$ flowing in the conventional word line 10 yield two magnetic fields on the free layer 1104. In response to the magnetic fields generated by the currents $I_1$ and $I_2$, the magnetic vector in free layer 1104 is oriented in a particular, stable direction. This direction depends on the direction and amplitude of $I_1$ and $I_2$ and the properties and shape of the free layer 1104. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Stored data is read or sensed by passing a current through the conventional MTJ cell from one magnetic layer to the other. During reading, the conventional transistor 13 is turned on and a small tunneling current flows through the conventional MTJ cell. The amount of the current flowing through the conventional MTJ cell 11 or the voltage drop across the conventional MTJ cell 11 is measured to determine the state of the memory cell. In some designs, the conventional transistor 13 is replaced by a diode, or completely omitted, with the conventional MTJ cell 11 in direct contact with the conventional word line 10.

Although the above conventional MTJ cell 11 can be written using the conventional word line 10 and conventional bit line 12, one of ordinary skill in the art will readily recognize that the amplitude of $I_1$ or $I_2$ is in the order of several milli-Amperes for most designs. Therefore, one of ordinary skill in the art will also recognize that a smaller writing current is desired for many memory applications.

FIG. 2 depicts a portion of a conventional magnetic memory 1' that has a lower writing current. Similar systems are described in U.S. Pat. No. 5,659,499, U.S. Pat. No. 5,940,319, U.S. Pat. No. 6,211,090, U.S. Pat. No. 6,153,443, and U.S. Patent Application Publication No. 2002/0127743. The conventional systems and conventional methods for fabricating the conventional systems disclosed in these references encapsulate bit lines and word lines with soft magnetic cladding layer on the three surfaces not facing MTJ cell 11'. Many of the portions of the conventional memory depicted in FIG. 2 are analogous to those depicted in FIG. 1 and are thus labeled similarly. The system depicted in FIG. 2 includes the conventional MTJ cell 11', conventional word line 10' and bit line 12'. The conventional word line 10' is composed of two parts: a copper core 1001 and a soft magnetic cladding layer 1002. Similarly, the conventional bit line 12' is composed of two parts: a copper core 1201 and a soft magnetic cladding layer 1202.

Relative to the design in FIG. 1, the soft magnetic cladding layers 1002 and 1202 can concentrate the magnetic flux associated with $I_1$ and $I_2$ onto the MTJ cell 11' and reduce the magnetic field on the surfaces which are not facing the MTJ cell 11'. Thus, the sot magnetic cladding layers 1002 and 1202 concentrate the flux on the MTJ that makes up the MTJ cell 11', making the free layer 1104 easier to program.

Although this approach works well theoretically, one of ordinary skill in the art will readily recognize that the magnetic properties of the portions of the soft cladding layers 1002 and 1202 on the vertical sidewalls of the conventional lines 10' and 12', respectively, are hard to control. One of ordinary skill in the art will also recognize that the process of making the conventional word line 10' and the conventional bit line 12' is complicated. Formation of the conventional word line 10' and conventional bit line 12' including the cladding layers 1002 and 1202, respectively, requires approximately nine thin film deposition steps, five photolithography steps, six etching steps, and one chemical mechanical polishing (CMP) step. Furthermore, none of the processes can be shared with other CMOS processes. Some of the processes, such as the CMP process and a few thin-film deposition and etching processes, need to be tightly controlled in order to achieve the designed performance. Because the wafer surface on which the devices are fabricated is not flat and the portion to be removed is deep in the trenches, the write lines 10' and 12' need to be laid out fairly sparsely to accommodate the photolithography process. As a consequence, the density and capacity of memory devices on a chip will be sacrificed if soft magnetic cladding layer 1202 and 1002 is used for the lines 10' and 12'. This complicated fabrication methods pose significant challenge to scaling to higher densities. Accordingly it is highly desirable to provide an MRAM architecture which is scalable, easy to fabricate, and offers high writing efficiency.

Other aspects of the conventional write lines 10, 10', 12, and 12' of the conventional designs depicted in both FIG. 1 and FIG. 2 limit scalability. In these conventional designs, the conventional write lines 10, 10', 12, and 12' are mostly made of either aluminum or copper. The current density limits for aluminum and copper are in the order of $1 \times 10^6$ A/cm$^2$ or less. As the line width decreases to increase the memory density, the electromigration current density limit poses severe challenges for scaling.

Other conventional systems attempt to propose different solutions, each of which has its drawbacks. As an example, U.S. Patent Application Publication No. 2002/0080643 proposed that, after a write operation, a reverse current is applied to the write lines to prevent electromigration. But such conventional methods compromise performance by reducing the speed of the memory and add complexities. Thus, it is also highly desirable to have write line made of materials with high reliability in electromigration, which will allows for easy scalability to high density memory arrays.

Conventional thin bit lines, which might be used for smaller or more efficient memories have shortcomings. Thinner conventional bit lines have higher resistances. This adversely affects the performance of the overall memory array. However, there are many conventional methods of overcoming this issue. One common practice is to break up the long bit lines in the memory array into global bit lines that are made of thick metals, and connect the global bit lines into local bit lines that are made of thinner metals, and thus have a higher resistance. Examples of such design are taught by U.S. Pat. No. 6,335,890 and U.S. Patent Application Publication No. 2002/0034117. However, the other problems described above, such as the electromigration are still not overcome.

Similarly, other conventional systems break write lines into segments, each of which is coupled, through a selection transistor, to a global write line having a much lower resistance. For example, U.S. Pat. No. 6,335,890 and U.S. Patent Application Publication No. 2002/0176272 describe systems which break conventional write lines into segments. During writing, only one segment of the conventional write line conducts current.

FIG. 3 depicts such a conventional design 20 incorporating a conventional segmented write line. The conventional design 20 includes conventional MTJs 31 serving as MRAM cells, a conventional segmented magnetic write line 32, conventional global write and return lines 301 and 302, respectively, conventional selection transistors 305, conventional digit lines 303, and conventional bit selection transistors 304. The conventional segmented write line 32 is connected to the conventional global write line 301 and to the conventional global write return line 302, through the conventional section selection transistor 305. Other segments (not shown) would be connected to the conventional global write line 301 and conventional global write return line 302 in a similar manner. For illustration, the section of the conventional segmented write line 32 is connected to four conventional MTJs 31. In a conventional configuration, each conventional MTJ 31 is then connected to a ground line through a conventional bit selection transistor 304. The conventional digit line 303 runs orthogonal to the conventional write line 32 at each conventional MTJ 31.

During writing, the conventional transistor 305 is turned on to allow a write current to flow from the conventional global write line 301, through the segment of the conventional segmented write line 32, to the conventional to global write return line 302. The magnetic field generated by the write current in the conventional segmented write line 32 simultaneously disturbs the magnetic vectors of the free layers of the four conventional MTJs 31 contained in the section. Depending on the magnitude and polarities of currents flowing in the conventional digit lines 303, digital data are written into the conventional MTJs 31. In this way four MRAM cells can be written at the same time.

Although four MRAM cells can be written in parallel, one of ordinary skill in the art will readily recognize that during reading only one of the four bit selection transistors 304 can be turned on. When one of the four bit selection transistors 304 is turned on, the voltage on the conventional global write line 301 (as connected to the conventional segmented write line 32) can be measured to determine the logical state of the selected MTJ 31. Thus, although data in the four cells of the section can be written in parallel, the data stored in the four cells are read in series. One of ordinary skill in the art will readily recognize, therefore, that reading of data stored in the MTJs 31 may be less efficient than desired. Furthermore, other problems described above, such as the electromigration are still not overcome.

Accordingly, what is needed is a system and method for providing a scalable, efficient, low current magnetic memory that improves ease of manufacturing and reliability against electromigration. It would also be desirable to provide an architecture which can support a simpler driver design, and can be read more efficiently. Moreover, it is desirable to arrange the global write lines such that there is minimal magnetic interference induced by the currents flowing in the global write lines on MRAM cells. It would also be desirable to achieve a system and method for providing a high-density nonvolatile MRAM capable of having greater margin in writing as well as efficient reading operations. The present invention addresses such a need.

SUMMARY OF THE INVENTION

The present invention provides a method and system for providing a magnetic random access memory (MRAM) array. The method and system comprise providing MRAM array including magnetic storage cells, global word lines, magnetic word lines, read bit lines, selection devices, and write bit lines. Each magnetic word line has segments. Each segment is coupled with the global word line(s) such that each segment is separately selectable. Each segment is also coupled to a portion of the magnetic storage cells. The read bit lines are oriented at an angle with respect to the magnetic word lines. The read bit lines are coupled with the magnetic cells through the selection devices. The write bit lines are substantially parallel to the read bit lines. Preferably, the magnetic word lines include soft magnetic materials and are coupled to each magnetic storage cell through a thin, nonmagnetic layer. To reduce interference from currents in global word lines, the global word lines are also substantially parallel to the magnetic word lines.

According to the system and method disclosed herein, the present invention provides a magnetic memory having improved writing margin and reading efficiency.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
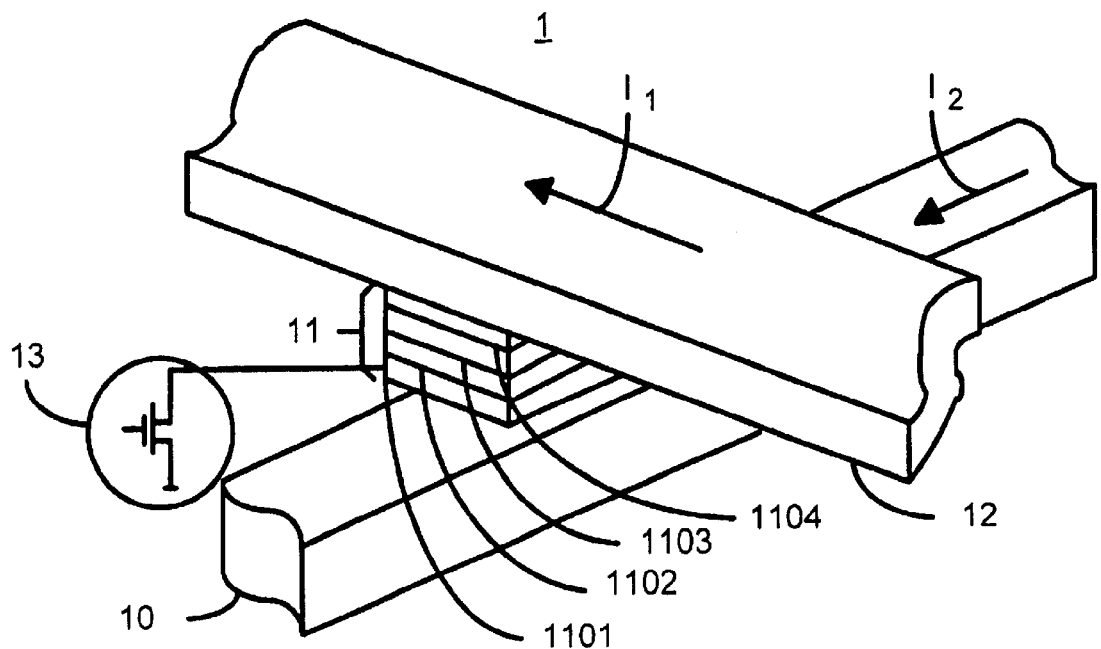
FIG. 1 is a three-dimensional view of a conventional in a conventional MRAM cell, located at the intersection of a conventional bit line and a conventional word line.
Figure 2:
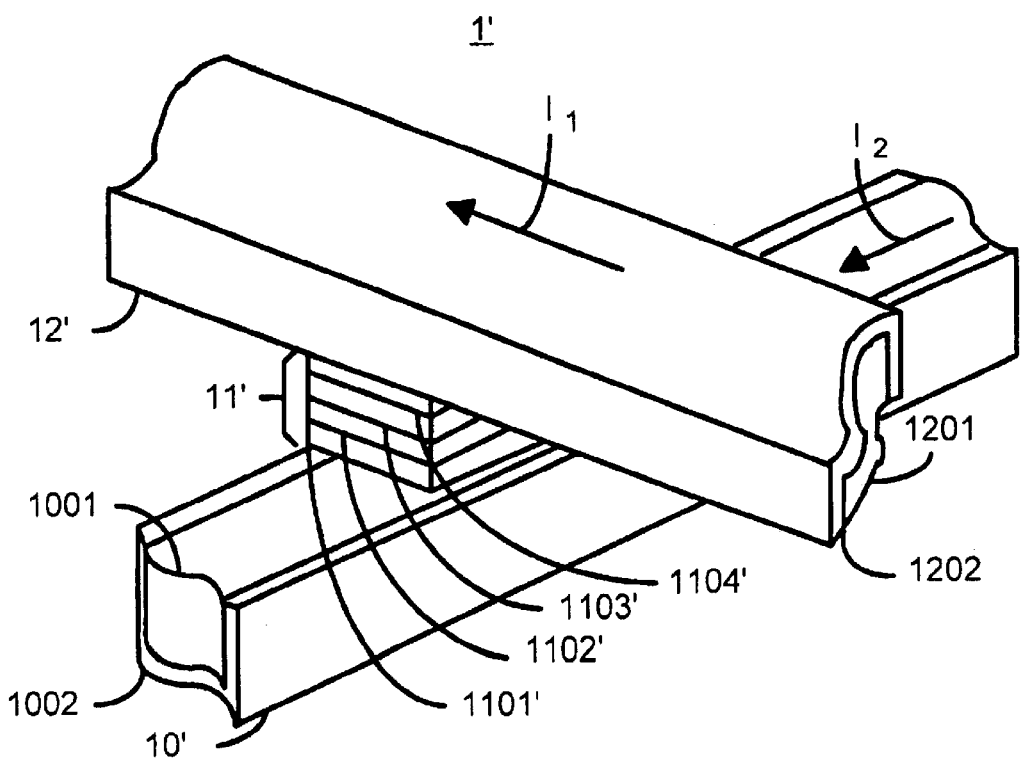
FIG. 2 is a side view of a conventional MTJ in a conventional MRAM cell with a conventional magnetic write line.
Figure 3:
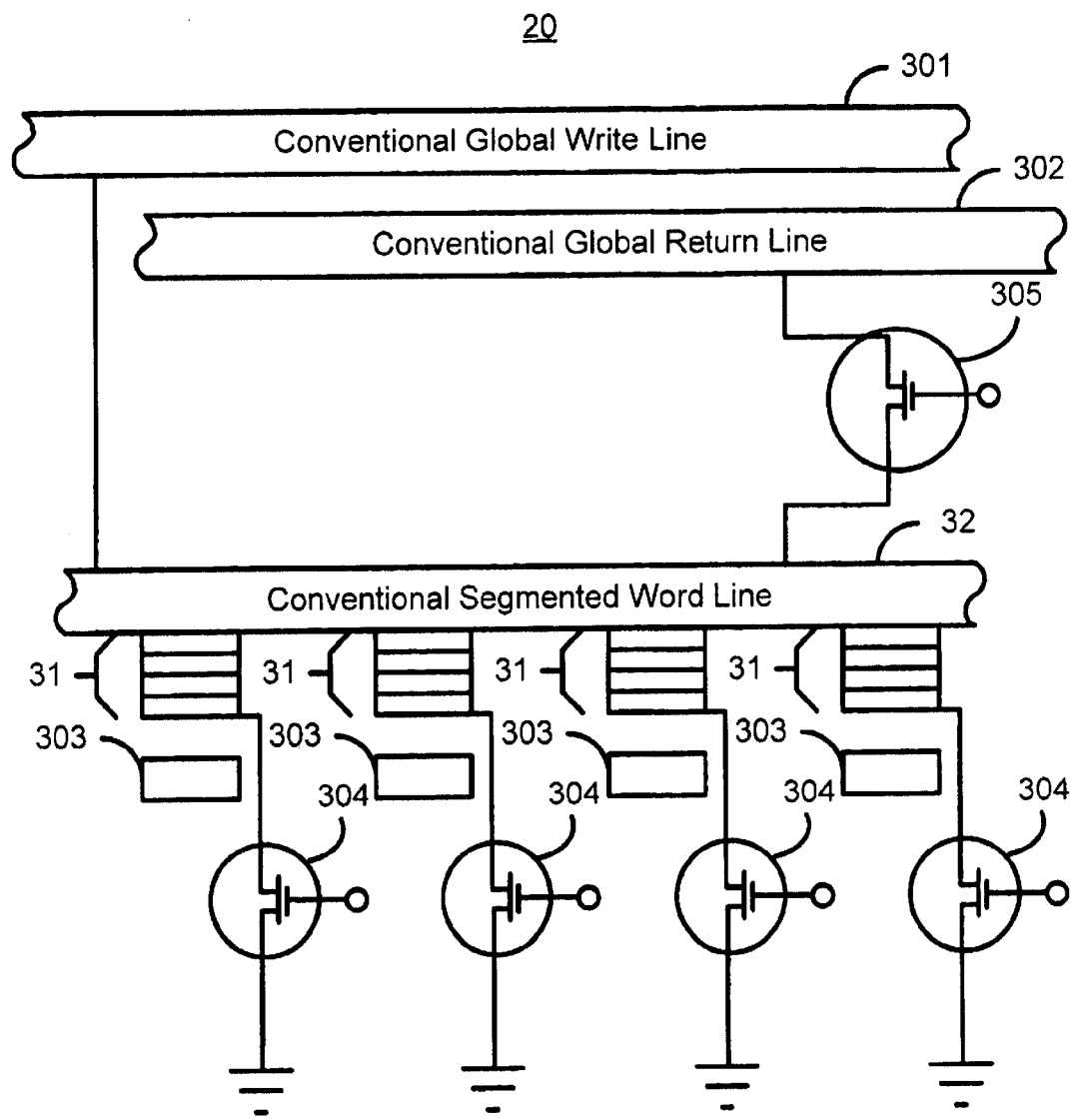
FIG. 3 is a diagram depicting a conventional configuration of conventional segmented magnetic write lines.
Figure 4:
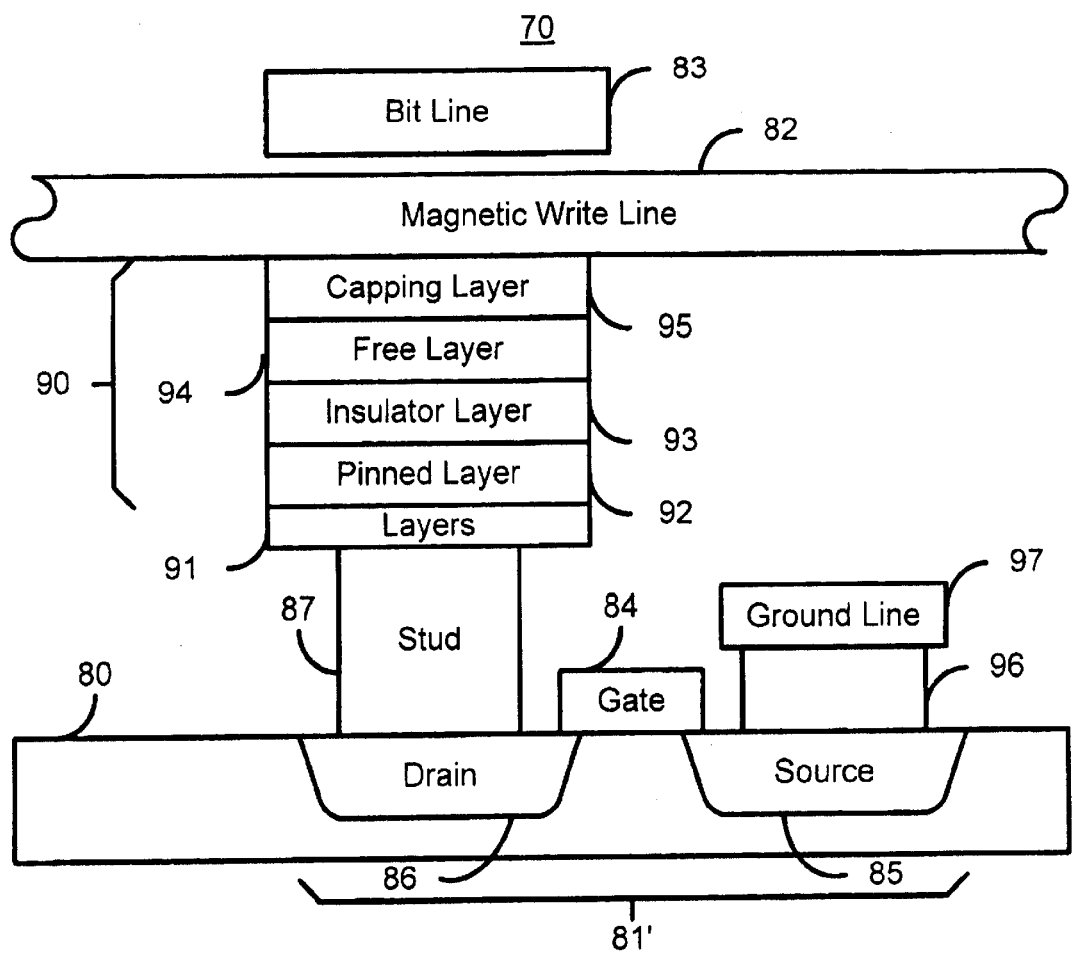
FIG. 4 is a diagram depicting one embodiment of a portion of an MRAM utilizing magnetic write lines.

Co-pending U.S. patent application Ser. No. 60/431,742 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application. FIG. 4 depicts one embodiment of a portion of an MRAM 70 including the basic structure described in the above-identified co-pending application. The MRAM 70 depicted in FIG. 4 includes a magnetic element 90, which is preferably a MTJ stack 90, a selection device 81 formed in a substrate 80, a magnetic write line 82, a bit line 83, a conductive stud 87, connecting stud 96 and ground line 97. The selection device 81 is preferably a FET transistor including gate 84, source 85 and drain 86. The MTJ stack includes the pinned layer 92 having a fixed magnetic vector (not shown), a tunneling layer 93, a free layer 94 having a changeable magnetic vector (not shown), and a conductive capping layer 95. The conductive capping layer 95 is preferably a nonmagnetic spacer layer 95. The MTJ stack also includes layers (not explicitly shown) that includes seed and, preferably, antiferromagnetic layers.

The magnetic write line 82 includes soft magnetic materials and is separated from the free layer 94 of the MTJ stack 90 by the non-magnetic spacer layer 95. In one embodiment, the write line 83 is also magnetic. The magnetic write line 82 is preferably substantially or completely composed of a soft magnetic material. In addition, at least a core, as opposed to a cladding layer, includes the soft magnetic layer. Due to the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, using the method and system described in the above-identified co-pending application, a lower current can be used because of the strong magnetic coupling between the soft magnetic bit line 82 and the MTJ 90. Furthermore, because of the excellent electromigration reliability of magnetic alloys, the magnetic write lines can be made thin for ease of fabrication and better packing density.

Although the method and system described in the above-identified co-pending application function well for their intended purpose, one of ordinary skill in the art will readily recognize that the magnetic write lines often have a relatively high resistance. Due to the combination of the small thickness and the use of the higher resistivity of magnetic alloys, the line resistance of magnetic write lines may be much larger than conventional write lines of primarily copper or aluminum. This high resistivity can create difficulties for write driver circuit designs.

The present invention provides a method and system for providing a magnetic random access memory (MRAM) array. The method and system comprise providing MRAM array including magnetic storage cells, global word lines, magnetic word lines, read bit lines, selection devices, and write bit lines. Each magnetic word line has segments. Each segment is coupled with the global word line(s) such that each segment is separately selectable. Each segment is also coupled to a portion of the magnetic storage cells. The read bit lines are oriented at an angle with respect to the magnetic word lines. The read bit lines are coupled with the magnetic cells through the selection devices. The write bit lines are substantially parallel to the read bit lines. Preferably, the magnetic word lines include soft magnetic materials and are coupled to each magnetic storage cell through a thin, nonmagnetic layer. To reduce interference from currents in global word lines, the global word lines are also substantially parallel to the magnetic word lines.

The present invention will be described in terms of particular types of magnetic memory cells, particular materials and a particular configuration of elements. However, one of ordinary skill in the art will readily recognize that this method and system will operate effectively for other magnetic memory cells, and other materials and configurations non inconsistent with the present invention.

Figure 5:
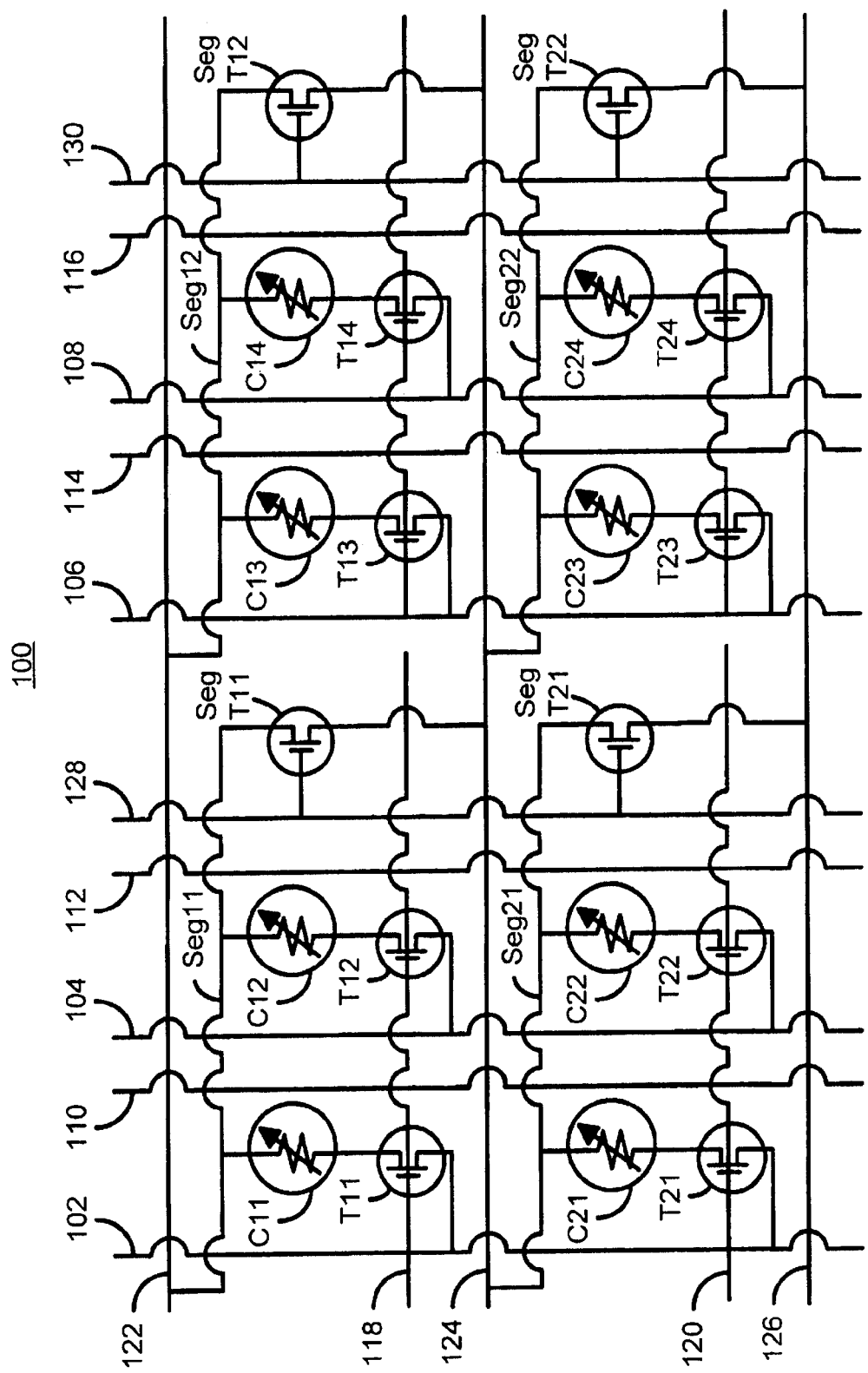
FIG. 5 is a schematic diagram illustrating one embodiment of a portion of an MRAM in accordance with the present invention.

To more particularly illustrate the method and system in accordance with the present invention, refer now to FIG. 5, depicting one embodiment of an MRAM array 100 in accordance with the present invention. The MRAM array includes magnetic storage cells C11, C12, C13, C14, C21, C22, C23, and C24. The magnetic storage cells C11, C12, C13, C14, C21, C22, C23, and C24 are preferably MTJs, as depicted in FIG. 4. However, in an alternate embodiment, other types of cells, such as GMR or AMR cells, could be used. Each magnetic storage cell C11, C12, C13, C14, C21, C22, C23, and C24 is coupled with a corresponding selection device T11, T12, T13, T14, T21, T22, T23, and T24, respectively. In a preferred embodiment, the selection devices T11, T12, T13, T14, T21, T22, T23, and T24, are selection transistors. In an alternate embodiment, however, other selection devices, such as diodes, may be used. The MRAM array includes read bit lines 102, 104, 106, and 108; write bit lines 110, 112, 114, and 116; read word lines 118 and 120; and global write word lines 122, 124, and 126. The MRAM array also includes magnetic word lines that are divided into segments, Seg11, Seg12, Seg21, and Seg22. Also included are segment selection transistors SegT11, SegT12, SegT21, and SegT22 and Segment Selection lines 128 and 130. Each segment Seg11, Seg12, Seg21, and Seg22 is connected to global write word lines 122 and 124 through segment selection transistors, SegT11, SegT12, SegT21, and SegT22, respectively. The segment selection transistors SegT11 and SegT12 and segment selection transistors SegT21, and SegT22 are selected using lines Segment Select 128 and Segment Select 130, respectively.

To minimize the interference of write current in the global write lines 122, 124, and 126 with the MTJ cells C11, C12, C13, C14, C21, C22, C23, and C24, the global write word lines 122, 124, and 126 are arranged substantially parallel to the magnetic word lines Seg11, Seg12, Seg21, and Seg22. The magnetic vectors of the magnetic word lines Seg11, Seg12, Seg21, and Seg22 are substantially parallel to the lengthwise direction of the magnetic word lines Seg11, Seg12, Seg21, and Seg22 (i.e. horizontal in FIG. 5). Thus, the magnetic word lines Seg11, Seg12, Seg21, and Seg22 are permeable in response to magnetic field orthogonal to the magnetic word lines Seg11, Seg12, Seg21, and Seg22 (i.e. vertically). However, the magnetic word lines Seg11, Seg12, Seg21, and Seg22 are not permeable in response to magnetic field parallel to the lines. In this fashion the magnetic word lines Seg11, Seg12, Seg21, and Seg22 provide good magnetic shielding against external magnetic fields orthogonal to the magnetic word lines Seg11, Seg12, Seg21, and Seg22. Therefore currents in global word lines 122, 124, and 126 running parallel to the magnetic word lines Seg11, Seg12, Seg21, and Seg22 produces field orthogonal to the magnetic word lines Seg11, Seg12, Seg21, and Seg22, and, therefore, the least magnetic interference on MRAM cells.

In the example given, each segment Seg11, Seg12, Seg21, and Seg22 of the magnetic word line is connected to two magnetic storage cells C11, C12, C13, C14, C21, C22, C23, C24. For example, the segment of magnetic word line Seg11 is connected to MTJs C11 and C12, and so on. In practice, the number of storage cells C11, C12, C13, C14, C21, C22, C23, C24 connected to each magnetic word line segment Seg11, Seg12, Seg21, and Seg22 is determined by the memory configuration and the required write current through the word line. The larger the write current in the magnetic word line Seg11, Seg12, Seg21, and Seg22, the larger the size of the segment selection transistors, SegT11, SegT12, SegT21, and SegT22. With larger segment selection transistors SegT11, SegT12, SegT21, and SegT22, there is also a need to increase the number of cells connected to each magnetic word line segment Seg11, Seg12, Seg21, and Seg22 for higher packing density. Segmented magnetic word lines Seg11, Seg12, Seg21, and Seg22 improve writing efficiency, and thus minimize dimensions of these segment selection transistors SegT11, SegT12, SegT21, and SegT22, improve packing density, and provide more flexibility in determining the number of cells per segment.

Each MTJ C11, C12, C13, C14, C21, C22, C23, and C24 has one end in contact with the segmented word line Seg11, Seg12, Seg21, and Seg22. The other end of each MTJ C11, C12, C13, C14, C21, C22, C23, and C24 is connected to a read bit line 102, 104, 106, and 108, through a selection transistor T11, T12, T13, T14, T21, T22, T23, and T24. For example the MTJ C11 is connected to read bit line 102 through transistor T11, and so on. To write data into each MRAM cell C11, C12, C13, C14, C21, C22, C23, and C24, write bit lines 110, 112, 114, and 116 are also provided for each cell C11, C12, C13, C14, C21, C22, C23, and C24, in conjunction with the segmented word lines Seg11, Seg12, Seg21, and Seg22. The write bit lines 110, 112, 114, and 116 are arranged substantially orthogonal to the segmented word lines Seg11, Seg12, Seg21, and Seg22.

The architecture as shown in FIG. 5 allows parallel reading and writing of several bits. As an example, the following is a description of writing data to MRAM cells C23 and C24. Global Write Word Line 122 and Global Word Line 124 are connected respectively to a write driver current supply and return terminals. The write driver current supply and connections are not shown in FIG. 5 for simplicity. Next a voltage is applied to Segment Select 130 to turn on the segment selection transistor SegT22. A write disturb current is provided through the magnetic word line segment Seg22. Write currents are also supplied to Write Bit Line 114 and Write Bit Line 116. Polarities of the current will determine the logical state of the corresponding bit stored in C13 and C14, respectively.

To read the data stored in the MRAM cell C23 and C24, the Global Write Word Line 122 is connected to ground, and a read current is supplied to Read Bit Line 106 and Read Bit Line 108. Bit selection transistors T23 and T24 are turned on by a voltage on Read Word Line 120, allowing the read currents to flow from Read Bit Line 106 and 108, through MTJs C23 and C24 respectively, to ground. The voltages on Read Bit Line 106 and 108 are then measured to determine the logical contents of C23 and C24, respectively.

Thus, because of the use of soft magnetic material for the magnetic write line segments Seg11, Seg12, Seg21, and Seg22, in conjunction with thin nonmagnetic conductive spacer layers, the magnetic write line segments Seg11, Seg12, Seg21, and Seg22, are strongly coupled to the free layers of the MTJs C11, C12, C13, C14, C21, C22, C23, and C24. Consequently, a lower write current can be used. Because the magnetic word line has been segmented into segments Seg11, Seg12, Seg21, and Seg22, problems due to the high resistance of magnetic materials and the small thickness of the magnetic word line segments Seg11, Seg12, Seg21, and Seg22, can be mitigated. The MTJs C11, C12, C13, C14, C21, C22, C23, and C24 can be written in parallel. Furthermore, the MTJs C11, C12, C13, C14, C21, C22, C23, and C24 can be read in parallel. Thus, the efficiency of reading the C11, C12, C13, C14, C21, C22, C23, and C24 is improved.

A method and system has been disclosed for providing a magnetic random access memory having improved writing margin and more efficient reading. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic random access memory array comprising:
    a plurality of magnetic storage cells;
    a plurality of global word lines;
    a plurality of magnetic word lines, each of the plurality of magnetic word lines having a plurality of segments, each of the plurality of segments being coupled with at least one of the plurality of global word lines such that each of the plurality of segments is separately selectable, each of the plurality of segments being coupled to a portion of the plurality of magnetic storage cells;
    a plurality of read bit lines oriented at an angle with respect to the plurality of magnetic word lines;
    a plurality of selection devices, the plurality of read bit lines being coupled with the plurality of magnetic cells through the plurality of selection devices; and
    a plurality of write bit lines substantially parallel to the plurality of read bit lines.

2. The magnetic random access memory array of claim 1 wherein the plurality of magnetic storage cells further includes:
    a plurality of magnetic tunneling junctions, each of the magnetic tunneling junctions including a free layer and a pinned layer separated by an insulator layer, each of the plurality of magnetic tunneling junctions being in direct electrical contact with a segment of the plurality of segments.

3. The magnetic random access memory array of claim 2 wherein the segment is separated from the free layer of the magnetic tunnel junction element by at least one conducting non-magnetic spacer layer.

4. The magnetic random access memory array of claim 3 wherein the at least one conducting non-magnetic spacer layer has a thickness of 300 angstroms or less.

5. The magnetic random access memory array of claim 1 wherein the plurality of global word lines has a lower line resistance than the plurality of magnetic word lines.

6. The magnetic random access memory array of claim 1 wherein the plurality of global word lines is oriented substantially parallel to the plurality of magnetic word lines.

7. The magnetic random access memory array of claim 1 wherein the plurality of selection devices include a plurality of selection transistors.

8. The magnetic random access memory array of claim 1 wherein the plurality of read bit lines are connected to the plurality of magnetic storage cells through diodes.

9. A method for utilizing a magnetic random access memory array having a plurality of magnetic storage cells, a plurality of global word lines, and a plurality of magnetic word lines having a plurality of segments, each of the plurality of segments being coupled with at least one of the plurality of global word lines such that each of the plurality of segments is separately selectable, the method comprising the steps of:
   (a) in the write mode, driving a current through at lest one of the plurality of global word lines;
   (b) in the write mode, selecting at least one of the plurality of segments;
   (d) in the write mode, providing a first write current through the at least one of the plurality of segments; and
   (e) in the write mode, providing a second write current to a plurality of write bit lines;
   wherein the plurality of magnetic storage cells are coupled with a plurality of read bit lines through the plurality of selection devices, the plurality of read bit lines being oriented at an angle with respect to the plurality of magnetic word lines.

10. The method of claim 9 further comprising the steps of:
   (f) in a read mode, grounding a global word line, the read mode for reading a portion of the plurality of magnetic storage device, the portion of the plurality of magnetic storage cells including more than one storage cell;
   (g) in the read mode, providing a read current in a portion of the plurality of read bit lines;
   (h) in the read mode, activating a portion of the plurality of selection devices; and
   (i) in the read mode, reading a voltage across a portion of the plurality magnetic elements.

11. The method of claim 9 wherein the plurality of magnetic storage cells further includes a plurality of magnetic tunneling junctions, each of the magnetic tunneling junctions including a free layer and a pinned layer separated by an insulator layer, each of the plurality of magnetic tunneling junctions being in direct electrical contact with a segment of the plurality of segments.

12. The method of claim 11 wherein the segment is separated from the free layer of the magnetic tunnel junction element by at least one conducting non-magnetic spacer layer.

13. The method of claim 12 wherein the at least one conducting non-magnetic spacer layer has a thickness of 300 angstroms or less.

14. The method of claim 9 wherein the plurality of global word lines has a lower line resistance than the plurality of magnetic word lines.

15. The method of claim 9 wherein the plurality of global word lines is oriented substantially parallel to the plurality of magnetic word lines.

16. The method of claim 9 wherein the plurality of selection devices include plurality of selection transistors.

17. The method of claim 9 wherein the plurality of read bit lines are connected to the plurality of magnetic storage cells through diodes.

* * * * *